(12) United States Patent
Liu

(10) Patent No.: US 7,969,742 B2
(45) Date of Patent: Jun. 28, 2011

(54) BRACKET FOR MOUNTING HEAT SINK

(75) Inventor: Lei Liu, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 52 days.

(21) Appl. No.: 12/503,857

(22) Filed: Jul. 16, 2009

(65) Prior Publication Data
US 2011/0002104 A1    Jan. 6, 2011

(30) Foreign Application Priority Data

Jul. 1, 2009    (CN) .......................... 2009 1 0303918

(51) Int. Cl.
*H05K 7/20* (2006.01)

(52) U.S. Cl. ............. 361/709; 361/679.54; 361/704; 361/719; 165/80.3; 165/104.33; 165/185; 257/713; 257/718; 257/719; 174/16.3; 174/252

(58) Field of Classification Search ....... 361/679.46–55, 361/690–697, 700–712, 715–727, 736, 752; 165/80.2–5, 104.33, 104.34, 121–126, 185; 257/706–727; 174/16.3, 252; 24/297, 453, 24/457, 458, 508; 248/505, 510; 411/41, 411/45, 508–511, 518, 521, 913

See application file for complete search history.

(56) References Cited

U.S. PATENT DOCUMENTS

| | | | |
|---|---|---|---|
| 6,243,264 B1 * | 6/2001 | Bollesen et al. | 361/704 |
| 6,646,881 B1 * | 11/2003 | Lai et al. | 361/719 |
| 7,142,427 B2 * | 11/2006 | Reents | 361/704 |
| 7,142,430 B2 * | 11/2006 | Lee et al. | 361/719 |
| 7,190,586 B2 * | 3/2007 | Franz et al. | 361/704 |
| 7,190,591 B2 * | 3/2007 | Peng et al. | 361/719 |
| 7,193,854 B2 * | 3/2007 | Bonomo et al. | 361/719 |
| 7,239,518 B2 * | 7/2007 | Yang et al. | 361/704 |
| 7,254,028 B2 * | 8/2007 | Lee et al. | 361/704 |
| 7,301,774 B2 * | 11/2007 | Lee et al. | 361/719 |
| 7,345,880 B2 * | 3/2008 | Lo | 361/704 |
| 7,349,218 B2 * | 3/2008 | Lu et al. | 361/679.32 |
| 7,430,122 B2 * | 9/2008 | Li | 361/719 |
| 7,440,284 B1 * | 10/2008 | Lin | 361/719 |
| 7,460,372 B2 * | 12/2008 | Liao et al. | 361/704 |
| 7,570,490 B2 * | 8/2009 | Refai-Ahmed et al. | 361/719 |
| 7,573,716 B2 * | 8/2009 | Sun et al. | 361/719 |
| 7,576,989 B2 * | 8/2009 | Li et al. | 361/719 |
| 2003/0159819 A1 * | 8/2003 | Lee | 165/185 |

* cited by examiner

*Primary Examiner* — Michael V Datskovskiy
(74) *Attorney, Agent, or Firm* — Zhigang Ma

(57) ABSTRACT

A bracket is used to mount a heat sink to a printed circuit board (PCB). The heat sink can dissipate heat for an electronic component mounted on the PCB. Cantilevers can be detached from the bracket, and replaced by other cantilevers with different sizes to mount a plurality of heat sinks having different sizes.

13 Claims, 6 Drawing Sheets

BRACKET FOR MOUNTING HEAT SINK

BACKGROUND

1. Technical Field

The present disclosure relates to mounting brackets, and particularly to a mounting bracket for mounting a heat sink to a printed circuit board (PCB).

2. Description of Related Art

Heat generated by semiconductor components must be adequately and timely removed to prevent increased temperature from damaging the semiconductor components. One way for solving the heat dissipation problem is to attach heat dissipation devices, such as heat sinks, to PCBs, such as motherboards, on which the semiconductor components are arranged. Generally, a bracket is used to mount a heat dissipation device to a motherboard. Presently, different heat dissipation devices and motherboards are used. A bracket for mounting one kind of heat dissipation device generally does not fit for another kind of heat dissipation device, however designing another bracket for a different kind of heat dissipation device is time-consuming and costly.

DETAILED DESCRIPTION

Figure 1:
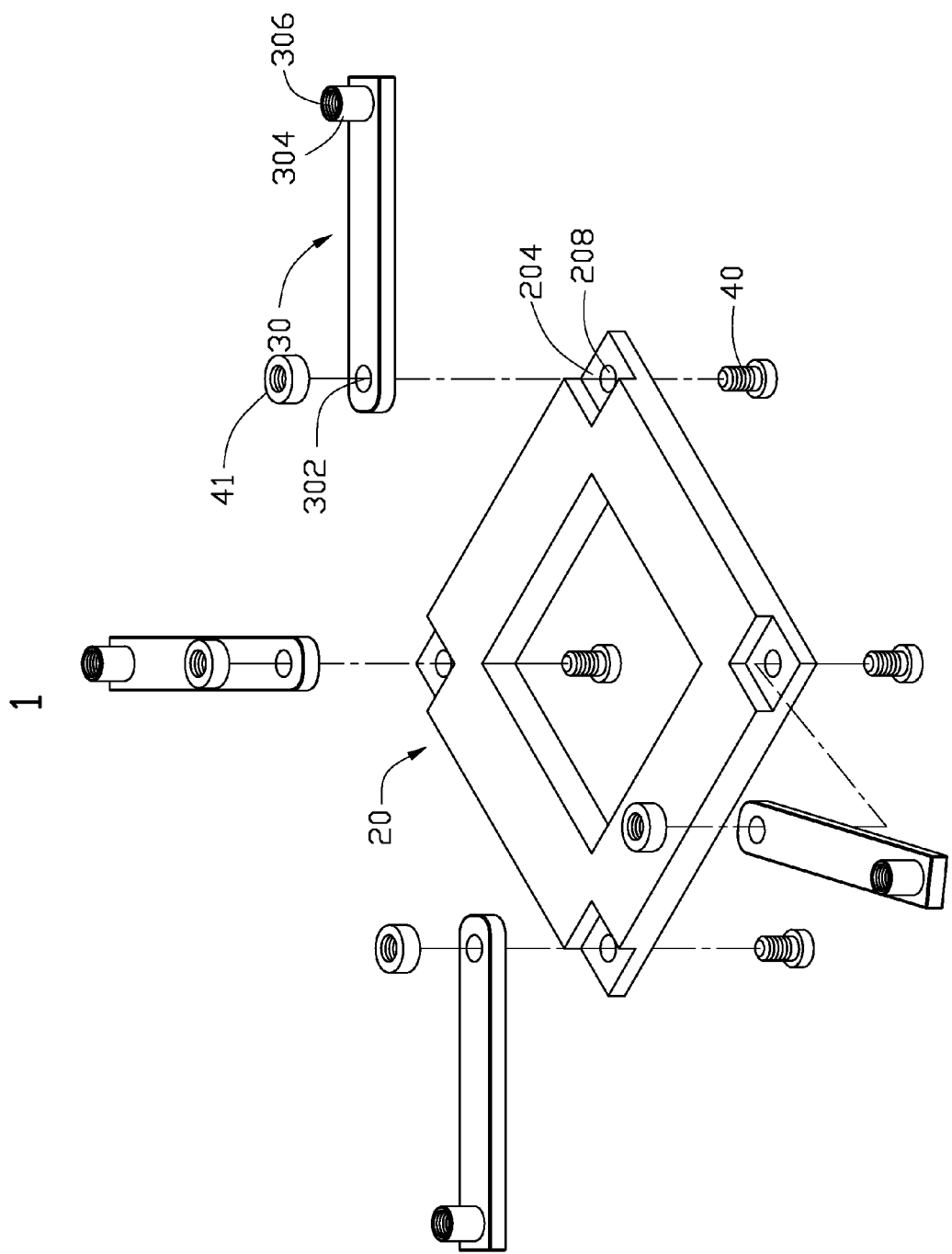
FIG. 1 is an exploded, isometric view of an exemplary embodiment of a bracket for mounting a heat sink.

Referring to FIG. 1, an exemplary embodiment of a bracket includes a support member 20, a plurality of cantilevers 30, and a plurality of mounting elements. The bracket is used to mount a heat sink to a printed circuit board (PCB). The heat sink can dissipate heat for an electronic component mounted on the PCB. Each mounting element may include a screw 40 and a nut 41.

The support member 20 is substantially square-shaped. A substantially square-shaped depressed portion 204 is defined in a corresponding corner of a top of the support member 20. A through hole 208 is defined in a bottom of each depressed portion 204.

Each cantilever 30 is substantially bar-shaped. A first end of each cantilever 30 is substantially circle-shaped. A mounting hole 302 is defined in the first end of each cantilever 30. An installing element 304 extends from a second end of each cantilever 30 opposite to the first end. A screw hole 306 is defined in each installing element 304. In other embodiments, each cantilever 30 can be changed to another shape according to requirements.

Figure 2:
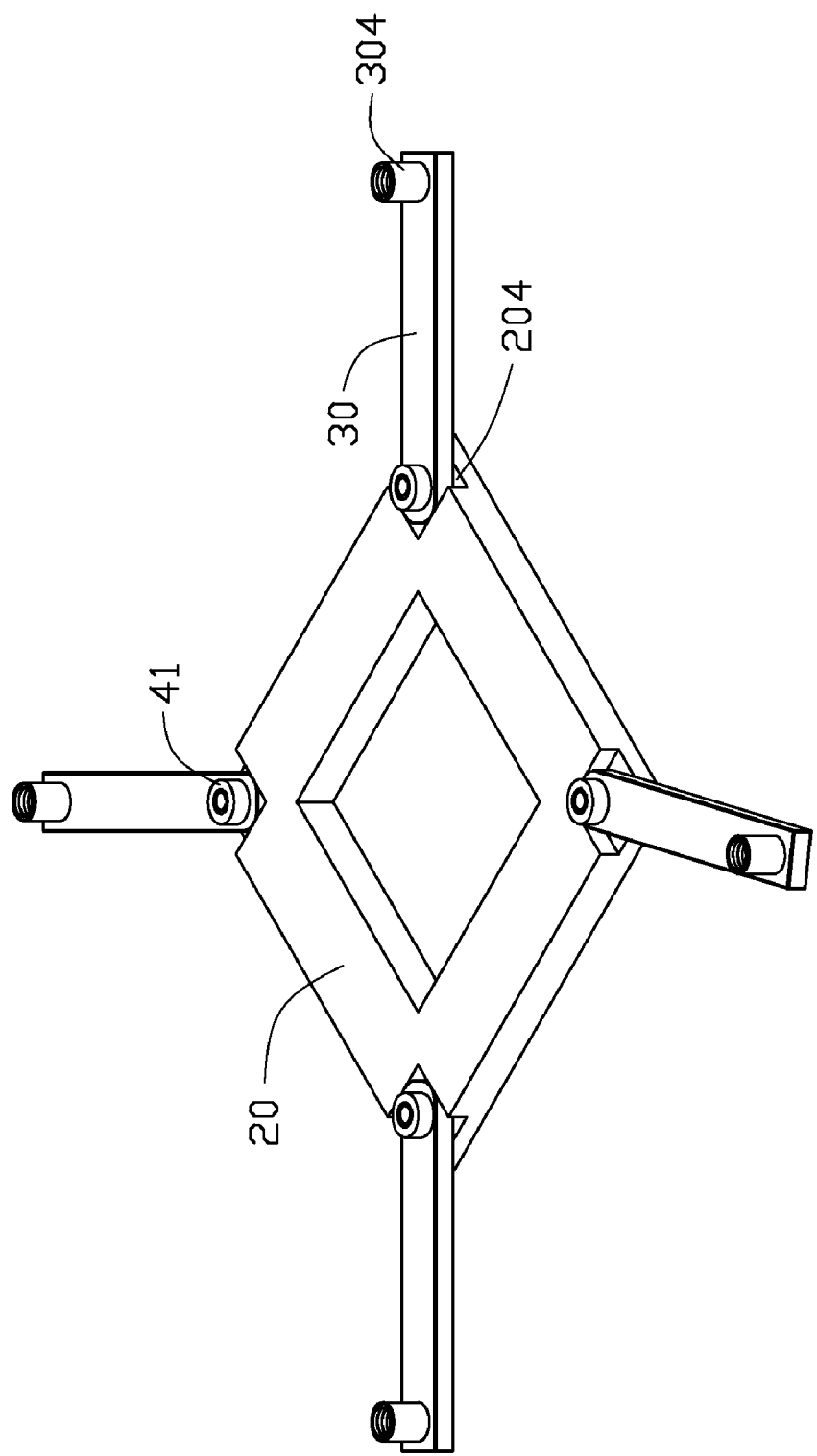
FIG. 2 is an assembled, isometric view of the bracket of FIG. 1.

Referring to FIG. 2, in assembly, the first end of each cantilever 30 is placed on the bottom of the corresponding depressed portion 204, with the mounting hole 302 of the cantilevers 30 aligned with the through hole 208 of the depressed portions 204. The screws 40 pass through the corresponding through holes 208 of the support member 20, the mounting holes 302 of the corresponding cantilevers 30, to engage with the corresponding nuts 41, thereby mounting the cantilevers 30 to the support member 20. Therefore, because of the flat-face contact between the respective cantilevers 30 and the support member 20 at the point of engagement therebetween, the cantilevers 30 can rotate relative to the support member 20 in a plane parallel to the support member 20 around the corresponding screws 40, and the cantilevers 30 radially extend from four corners of the support member 20.

Figure 3:
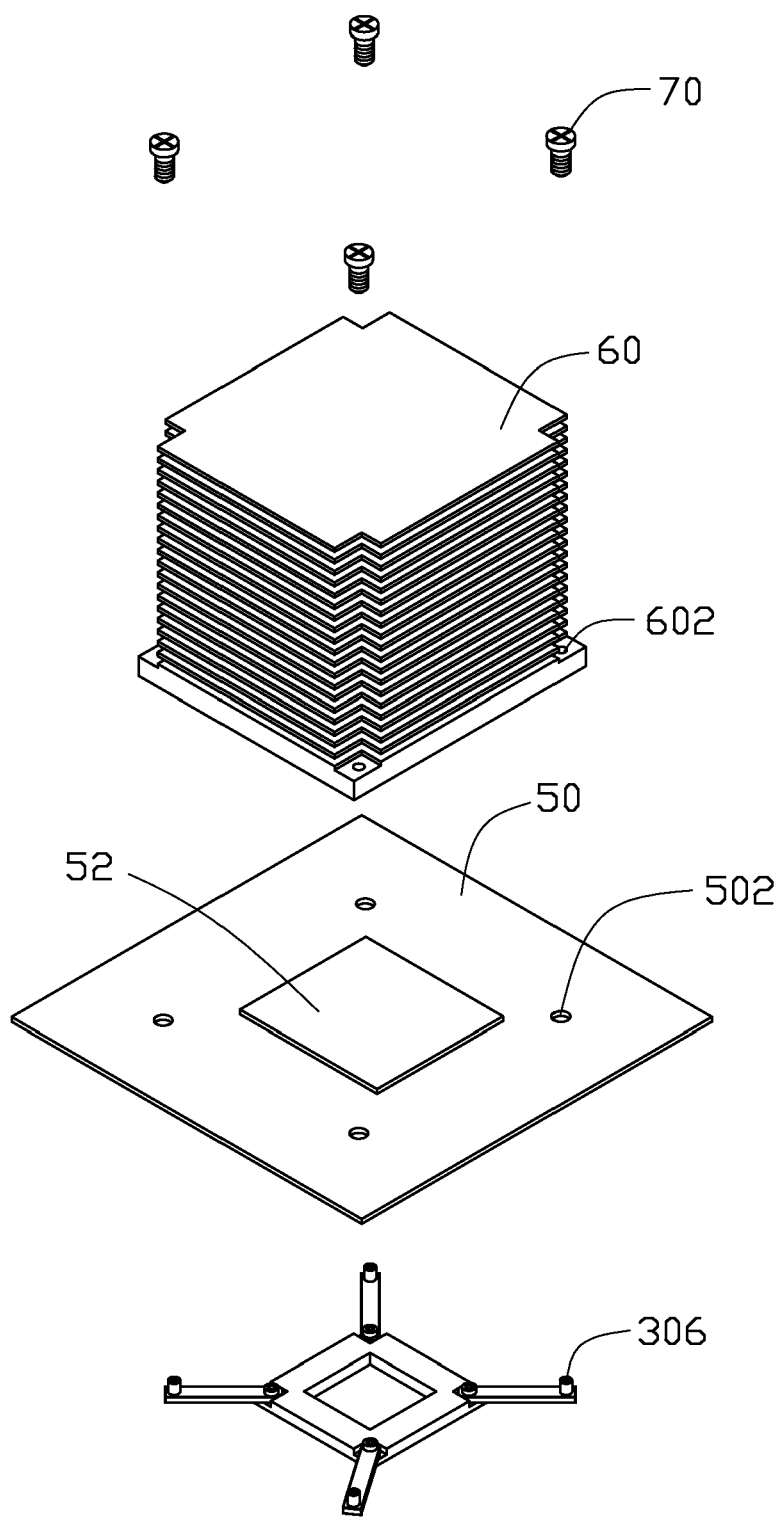
FIG. 3 is an exploded, isometric view of the bracket of FIG. 1, a first printed circuit board, and a first heat sink.
Figure 4:
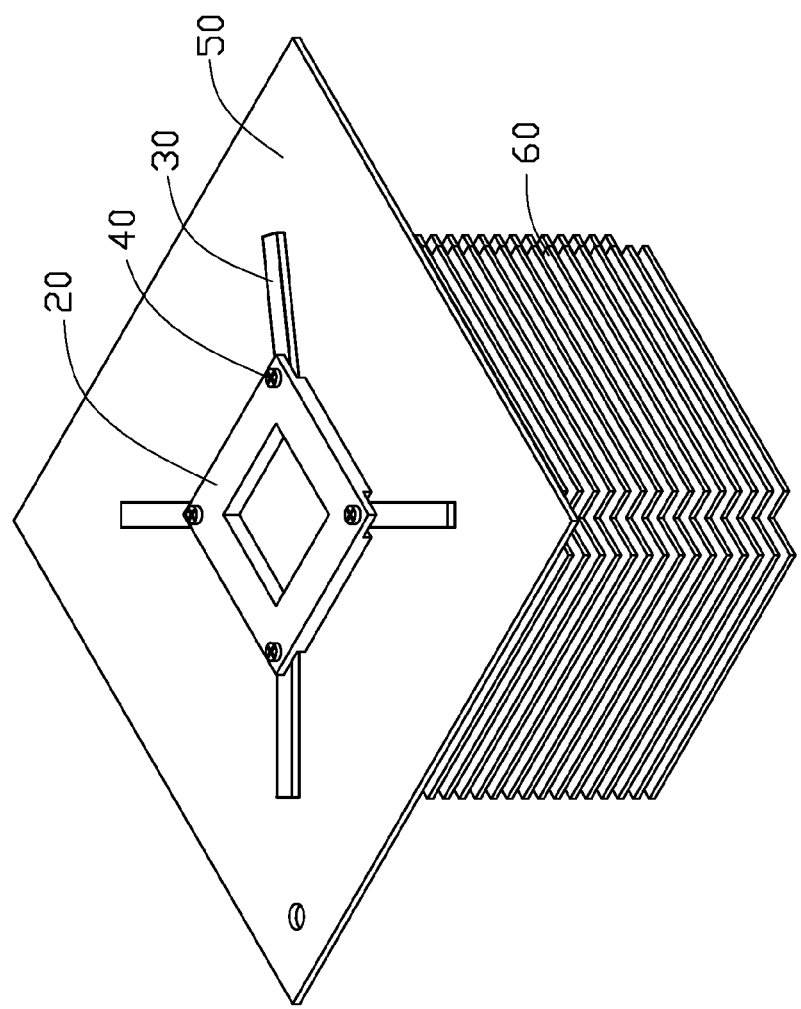
FIG. 4 is an assembled, isometric view of FIG. 3, but viewed from an inverted perspective.

Referring to FIGS. 3 and 4, when the bracket is used to mount a substantially square-shaped heat sink 60 to a PCB 50 defining four locating holes 502 around an electronic component 52 mounted on a first surface of the PCB 50, the cantilevers 30 are rotated, until the cantilevers 30 symmetrically extend out from the support member 20. The electronic component 52 may be a central processing unit on the PCB 50. The bracket is attached to a second surface opposite to the first surface of the PCB 50, with the installing elements 304 inserted into the corresponding locating holes 502 of the PCB 50. The heat sink 60 is attached on the electronic component 52. Fastening elements, such as screws 70, pass through assembly holes 602 defined in four corners of the heat sink 60, to engage in the screw holes 306 of the corresponding cantilevers 30. Therefore, the bracket mounts the heat sink 60 to the PCB 50.

Figure 5:
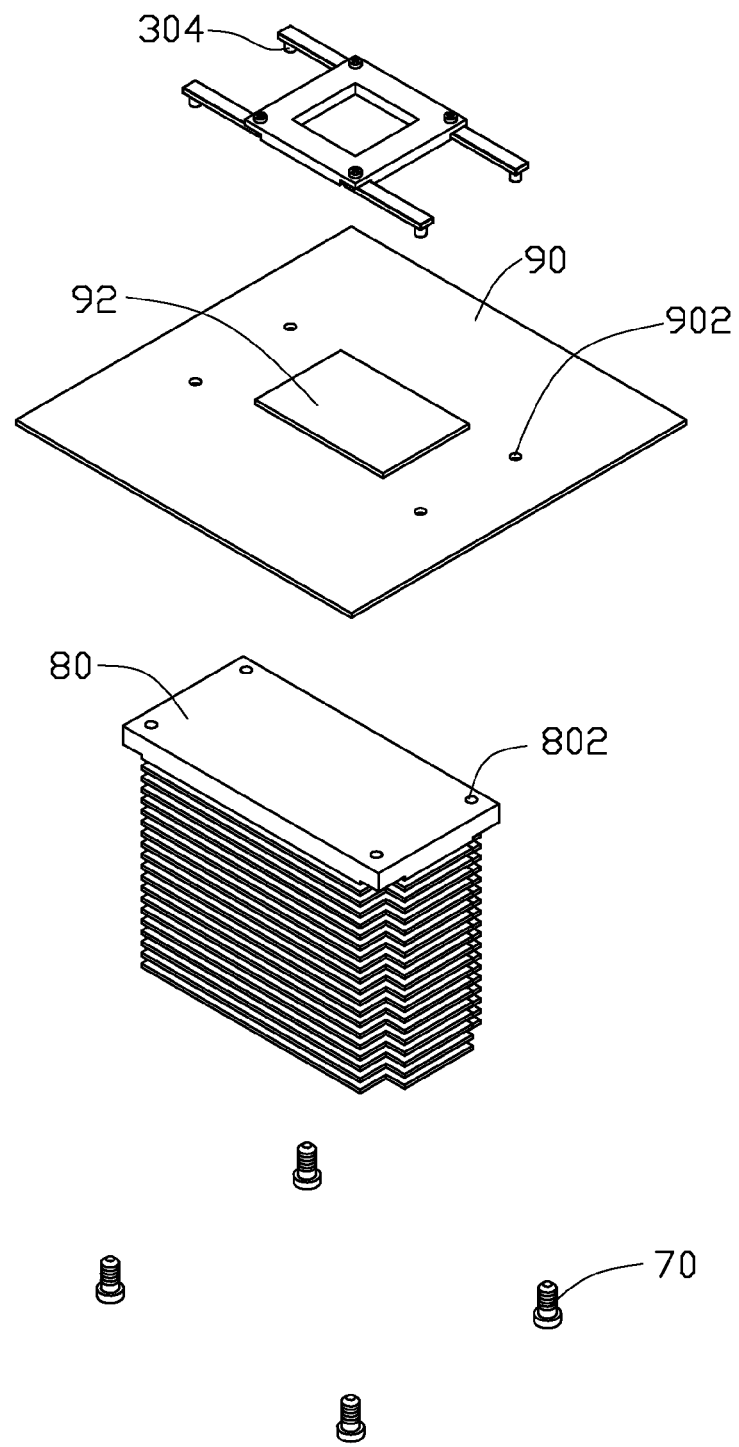
FIG. 5 is an isometric view of the bracket of FIG. 1, a second printed circuit board, and a second heat sink.
Figure 6:
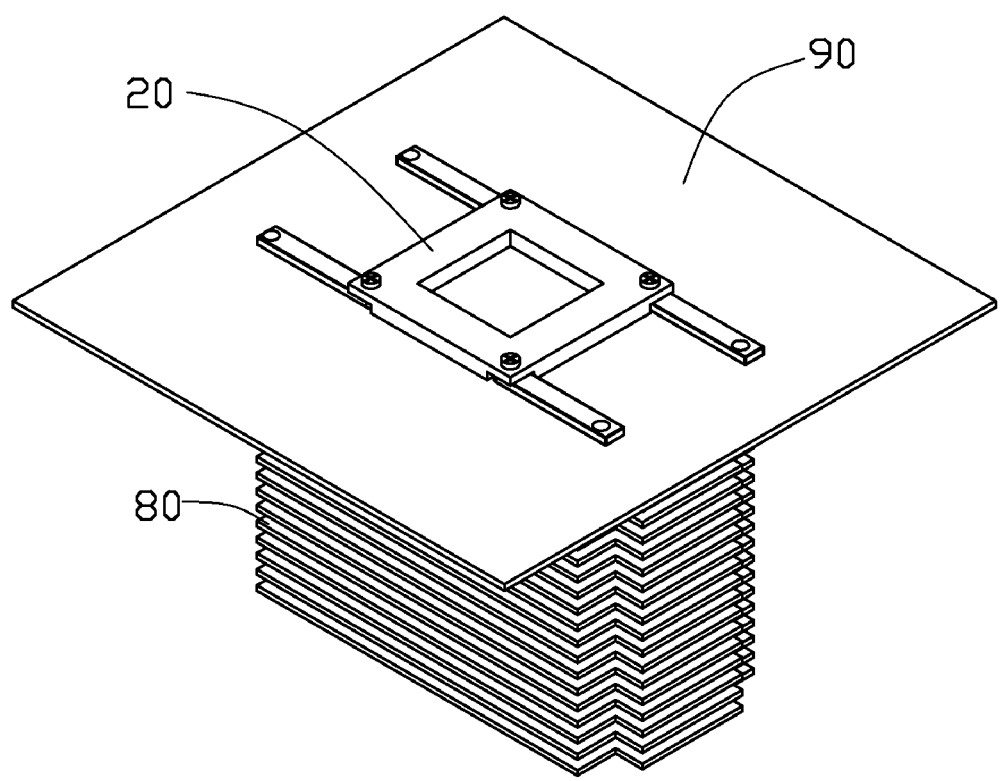
FIG. 6 is an assembled, isometric view of FIG. 5.

Referring to FIGS. 5 and 6, when the bracket is used to mount a substantially rectangular-shaped heat sink 80 to a PCB 90 defining four locating holes 902 around an electronic component 92 on the PCB 90, the cantilevers 30 are rotated, until the installing elements 304 are aligned with the corresponding locating holes 902 of the PCB 90. The installing elements 304 are inserted into the corresponding locating holes 902. Screws 70 pass through assembly holes 802 defined in four corners of the heat sink 80, to engage in the screw holes 306 of the corresponding cantilevers 30. Therefore, the bracket mounts the heat sink 80 to the PCB 90.

In other embodiments, when heat sink with another shape is mounted to a PCB, while the cantilevers 30 cannot be rotated to reach locating holes of the PCB. The cantilevers 30 can be detached from the support member 20, and replaced by other cantilevers with different sizes and/or shapes from the cantilevers 30, to mount the heat sink to the PCB.

It is to be understood, however, that even though numerous characteristics and advantages of the embodiments have been set forth in the foregoing description, together with details of the structure and function of the embodiments, the disclosure is illustrative only, and changes may be made in details, especially in matters of shape, size, and arrangement of parts within the principles of the embodiments to the full extent indicated by the broad general meaning of the terms in which the appended claims are expressed.

What is claimed is:

1. A bracket for mounting underneath a heat sink, the bracket comprising:

a support member; and a plurality of cantilevers detachably mounted to the support member, rotatable relative to the support member in a plane parallel to the support member, and radially extending from the support member, wherein an installing element is formed on each cantilever opposite to the support member, to mount the heat sink.

2. The bracket of claim 1, further comprising four screws and four nuts, wherein the support member comprises four corners, four depressed portions are defined in the four corners of the support member, a through hole is defined in a bottom of each depressed portion, a mounting hole is defined in a first end of each cantilever, wherein the screws pass through the corresponding through holes of the support member and the mounting holes of the corresponding cantilevers, to engage with the corresponding nuts, to detachably and rotatably mount the cantilevers to the support member.

3. The bracket of claim 2, wherein each depressed portion is substantially square-shaped, and the first end of each cantilever is substantially circle-shaped.

4. The bracket of claim 2, wherein the installing element is formed on a second end opposite to the first end of each cantilever.

5. The bracket of claim 4, wherein a screw hole is defined in each installing element, and screws are operable to pass through the heat sink to engage in the screw holes of the corresponding installing elements.

6. A system, comprising:
a printed circuit board (PCB) comprising an electronic component mounted on a first surface of the PCB, the PCB defining a plurality of locating holes therein around the electronic component;
a heat sink defining a plurality of assembly holes therein;
a support member attached to a second surface opposite to the first surface of the PCB;
a plurality of cantilevers each comprising a first end rotatably mounted to the support member and a second end extending out of the support member, the cantilever rotatable relative to the support member in a plane parallel to the support member, wherein an installing element is formed on each cantilever, corresponding to the plurality of assembly holes of the heat sink; and
a plurality of fastening members, wherein the plurality of fastening members are operable to pass through the plurality of assembly holes of the heat sink, the plurality of locating holes of the PCB, to engage with the plurality of installing elements of the plurality of cantilevers, respectively.

7. The system of claim 6, wherein the installing element is formed on the second end of each cantilever.

8. A system for mounting a heat sink having a plurality of assembly holes, the system comprising:
a printed circuit board (PCB) comprising an electronic component mounted on a first surface of the PCB, the PCB defining a plurality of locating holes therein around the electronic component;
a support member attached to a second surface opposite to the first surface of the PCB;
a plurality of cantilevers each comprising a first end detachably and rotatably mounted to the support member and a second end extending out of the support member, wherein an installing element is formed on the second end of each cantilever, and inserted into the corresponding locating holes of the PCB; and
a plurality of fastening members, wherein the plurality of cantilevers are rotatably adjusted such that the plurality of installing elements of the plurality of cantilevers align with the plurality of assembly holes correspondingly, and the plurality of fastening members pass through the plurality of assembly holes of the heat sink, to engage with the plurality of installing elements of the plurality of cantilevers.

9. The system of claim 8, wherein each installing element defines a screw hole, the plurality of fastening members are a plurality of screws to engage in the screw holes of the corresponding installing element, after passing through the corresponding assembly holes of the heat sink.

10. The system of claim 8, wherein the plurality of cantilevers comprise four cantilevers rotatably mounted to four corners of the support member.

11. The system of claim 10, wherein the support member comprises four corners, a depressed portion is defined in each corner of the support member, the depressed portion defines a through hole therein, the first end of each cantilever defines a mounting hole corresponding to the through hole of a corresponding depressed portion, wherein a fastener passing through each through hole and a mounting hole of a corresponding cantilever to detachably and rotatably mount the first end of each cantilever to the support member.

12. The system of claim 6, wherein a plurality of through holes is defined in the support member, the first end of each cantilever defines a mounting hole corresponding to one of the through holes, wherein a fastener passes through each through hole and the corresponding mounting hole to detachably and rotatably mount the first end of each cantilever to the support member.

13. The system of claim 12, wherein a plurality of depressed portions is defined in the support member, the through holes are respectively defined in the depressed portions, the first end of each cantilever is placed on a bottom of the corresponding depressed portion.

* * * * *